(12) United States Patent
Liaw (10) Patent No.: US 9,007,815 B2
(45) Date of Patent: Apr. 14, 2015

(54) METHOD AND APPARATUS FOR SWITCHING POWER IN A DUAL RAIL MEMORY

(75) Inventor: Jhon Jhy Liaw, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 463 days.

(21) Appl. No.: 13/359,663

(22) Filed: Jan. 27, 2012

(65) Prior Publication Data

US 2013/0194859 A1 Aug. 1, 2013

(51) Int. Cl.
*G11C 11/417* (2006.01)
*G11C 5/14* (2006.01)

(52) U.S. Cl.
CPC .... *G11C 5/14* (2013.01); *G11C 5/147* (2013.01); *G11C 11/417* (2013.01)

(58) Field of Classification Search
CPC ......... G11C 11/417; G11C 5/14; G11C 5/147
USPC .......... 365/154, 189.16, 189.11, 226, 189.05, 365/189.15
See application file for complete search history.

(56) References Cited

U.S. PATENT DOCUMENTS

| | | | |
|---|---|---|---|
| 7,447,058 B2 * | 11/2008 | Maki et al. | 365/154 |
| 7,502,275 B2 * | 3/2009 | Nii et al. | 365/226 |
| 7,643,357 B2 * | 1/2010 | Braceras et al. | 365/189.09 |
| 7,978,559 B2 * | 7/2011 | Kim et al. | 365/226 |
| 8,018,788 B2 * | 9/2011 | Jung et al. | 365/226 |
| 2006/0119393 A1 * | 6/2006 | Hua et al. | 326/121 |
| 2006/0262628 A1 * | 11/2006 | Nii et al. | 365/226 |
| 2007/0274124 A1 * | 11/2007 | Otsuka | 365/154 |
| 2009/0010053 A1 * | 1/2009 | Chiu et al. | 365/182 |
| 2009/0016138 A1 * | 1/2009 | Bhatia | 365/226 |
| 2009/0109733 A1 * | 4/2009 | Wong | 365/154 |
| 2009/0207675 A1 * | 8/2009 | Kengeri et al. | 365/189.14 |
| 2010/0309736 A1 * | 12/2010 | Russell et al. | 365/189.011 |

OTHER PUBLICATIONS

Ohbayashi, S. et al., "A 65 nm SoC Embedded 6T-SRAM Design for Manufacturing with Read and Write Cell Stabilizilng Circuits", 2006 Symposium on VLSI Circuits, Digest of Technical Papers, 2006, pp. 17-18.
Zhang, K. et al., "A 3-GHz 70Mb SRAM in 65 nm CMOS Technology with Integrated Column-Based Dynamic Power Supply", 2005 IEEE International Solid-State Circuits Conference, Digest of Technical Papers, Session 26-Non-Volatile Memory, 2005,3 pages.
Yamaoka, M. et al., "Low-Power Embedded SRAM Modules with Expanded Margins for Writing", 2005 IEEE International Solid-State Circuits Conference, Digest of Technical Papers, Session 26-Static Memory, 2005, 3 pages.
Zhang, K. et al., "A 3-GHz 70-Mb SRAM in 65-nm CMOS Technology With Integrated Column-Based Dynamic Power Supply", IEEE Journal of Solid-State Circuits, Jan. 2006, 41(1):147-151.

* cited by examiner

*Primary Examiner* — Douglas King
(74) *Attorney, Agent, or Firm* — Duane Morris LLP (57) ABSTRACT

A memory apparatus includes an array of bit cells arranged in rows and columns, multiple pairs of complementary bit lines, multiple power lines, and multiple voltage control circuits. Each column of the array is selectable by a corresponding pair of complementary bit lines. Each power line is coupled to the bit cells in a corresponding column. The voltage control circuits are coupled to respective columns of the array. Each voltage control circuit is configured to set a voltage level of a respective one of the power lines responsive to logic levels of the pair of complementary bit lines corresponding to the respective column.

12 Claims, 13 Drawing Sheets

METHOD AND APPARATUS FOR SWITCHING POWER IN A DUAL RAIL MEMORY

BACKGROUND

Static random access memory (SRAM) is a type of volatile semiconductor memory that stores data bits using bistable circuitry that does not need refreshing. A cell of a memory such as SRAM may be referred to as a bit cell because it stores one bit of information, represented by the logic state of two cross coupled inverters. Memory arrays include multiple bit cells arranged in rows and columns. Each bit cell in a memory array typically includes connections to a power supply voltage and to a reference (e.g., ground) voltage. Logic signals on bit lines control reading from and writing to a bit cell, with a word line controlling connections of the bit lines to the inverters, which otherwise float. A word line may be coupled to the bit cells in a row of a memory array, with different word lines provided for different rows. A pair of bit lines may be coupled to each column of bit cells. For a read operation at a bit cell, the corresponding bit lines may be precharged high (e.g., to a logical high value '1'), and the corresponding word line may be asserted. The resulting values at the bit lines may correspond to the logical value of the bit of information stored at the bit cell. To write a '1' into a bit cell, one of the corresponding bit lines, which may be denoted BL (which may stand for "bit line"), may be set to '1' and the other bit line, which may be denoted BLB (which may stand for "bit line bar"), may be set to '0', and the word line may be asserted. To write a logical low value, BL and BLB may instead be set to '0' and '1', respectively, and the word line may be asserted. The pair of bit lines BL, BLB may be referred to as a pair of complementary bit lines. It is understood nonetheless that the values at BL and BLB need not be logical complements of one another, e.g., as in the read operation described above, where BL and BLB are both set to '1'.

To improve memory access performance (e.g., write performance), dual rail power supply techniques have been used previously. In a dual rail power supply approach, a power supply voltage CVDD (which may stand for "cell VDD") may be provided to bit cells. CVDD may have a first voltage level (e.g., a power supply voltage VDD) in certain situations, e.g., for a first type of memory operation, and may have a second voltage level in other situations, e.g., for a second type of memory operation.

BRIEF DESCRIPTION OF THE DRAWINGS

The following will be apparent from elements of the figures, which are provided for illustrative purposes and are not necessarily to scale.

FIG. 2A: voltage control circuits controlling voltages for respective columns of an SRAM array; FIG. 2B: multiple voltage control circuits per column of an SRAM array; FIG. 2C: voltage control circuit controlling voltages for multiple columns of an SRAM array.

FIGS. 8A-8B are plan (top) views of layouts of SRAM bit cells in accordance with some embodiments. FIG. 8A: bit lines oriented parallel to reference voltage (e.g., VSS) lines; FIG. 8B: bit lines oriented perpendicular to VSS lines.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
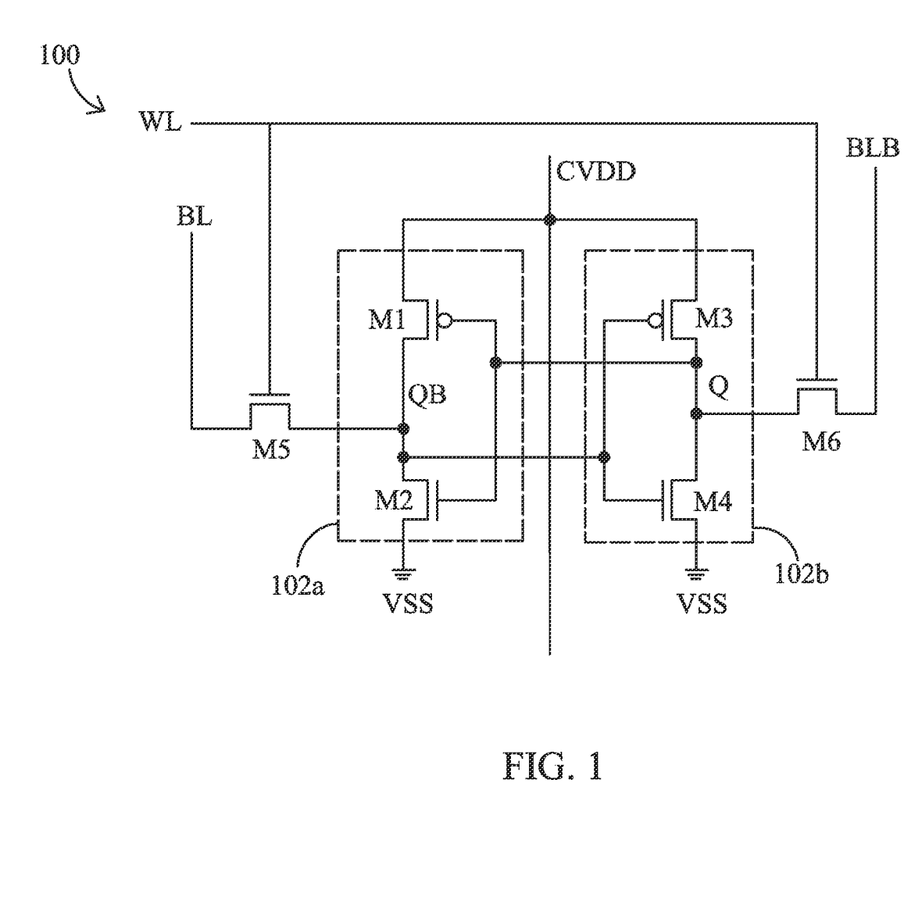
FIG. 1 is a circuit diagram of a static random access memory (SRAM) bit cell in accordance with some embodiments of the present disclosure.

FIG. 1 is a circuit diagram of a static random access memory (SRAM) bit cell in accordance with some embodiments of the present disclosure. An SRAM bit cell 100 includes a pair of access transistors M5 and M6 biased by a word line WL and providing access to cross-coupled inverters 102a and 102b, respectively, that are powered by a power line CVDD. Access transistors M5 and M6 pass signals on bit lines BL and BLB, respectively, to the nodes of the cross coupled inverters when the word line signal at the gate terminals of those respective transistors is asserted high. Inverter 102a includes a pull-up (PU) PMOS transistor M1 and a pull-down (PD) NMOS transistor M2, and inverter 102b includes a pull-up PMOS transistor M3 and a pull-down NMOS transistor M4. This configuration is referred to as a 6T (six-transistor) SRAM configuration. The transistors in the bit cell may be formed from planar metal oxide semiconductor field effect transistors (MOSFETs), silicon on insulator (SOI) MOSFETs, fin-type (3D) MOSFETs, fin-type SOI MOSFETs, multiple fin-type MOSFETs, or some combination thereof.

Figure 2A:
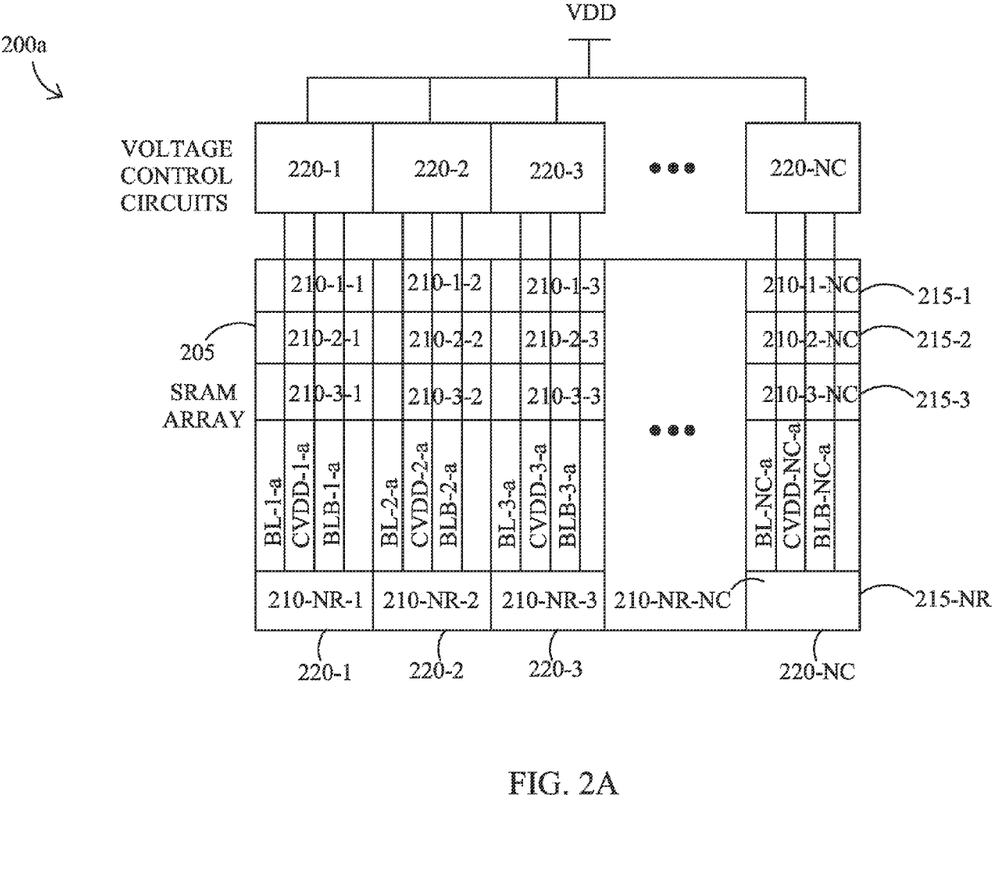
FIGS. 2A-2C are schematic illustrations of SRAM arrays coupled to voltage control circuits in accordance with various embodiments.

FIG. 2A is a schematic illustration of a memory apparatus in accordance with some embodiments. A memory apparatus 200 includes an array 205 of bit cells (e.g., SRAM bit cells) arranged in rows and columns. In the example shown in FIG. 2A, array 205 includes $N_R$ rows and $N_C$ columns, with the bit cells in the first row denoted 210-1-1, 210-1-2, etc., and the bit cells in the first column denoted 210-1-1, 210-2-1, etc. The rows are denoted 215-1, 215-2, ..., 215-NR, and the columns are denoted 220-1, 220-2, ..., 220-NC. Various numbers of rows and columns may be used. A pair of bit lines is associated with each column. The bit lines in the $i^{th}$ column are denoted BL-i-a and BLB-i-a. Each column of array 205 is selectable by a corresponding pair of bit lines. For example, to read a bit cell in column 220-2 and in a particular row, bit lines BL-2-a and BLB-2-a may be precharged high, and then the word line for that particular row may be asserted (word lines are not shown in FIG. 2A for graphical convenience). Power lines are coupled to the bit cells in respective columns. The power lines corresponding to columns 220-1, 220-2, etc. are denoted CVDD-1-*a*, CVDD-2-*a*, etc. Bit line pairs (BL-1-*a*, BLB-1-*a*), (BL-2-*a*, BLB-2-*a*), etc. may correspond to bit lines (BL, BLB) in FIG. 1, and power lines CVDD-1-*a*, CVDD-2-*a*, etc. may correspond to power line CVDD in FIG. 1, as FIG. 1 depicts a single bit cell in array 205 of FIG. 2.

Voltage control circuits 220-1, 220-2, . . . , 220-NC (collectively voltage control circuits 220) are coupled to respective columns of array 205. The voltage control circuit coupled to each column is configured to control a voltage level of the power line corresponding to that column, based on the pair of bit lines corresponding to that column. Each voltage control circuit is coupled to a power supply node VDD. In a dual rail SRAM implementation, voltage control circuits 220 may control the power lines for various columns (i.e., the power lines of the bit cells in such columns) to have a first voltage level substantially equal to VDD (e.g., for a read operation) or to have a second voltage level, e.g., a voltage level less than VDD (e.g., for a write operation). Providing a voltage level less than VDD, e.g., at least 30 mV less than VDD in some embodiments, to a bit cell for a write operation may support various write assist techniques to improve write performance. Internal details of voltage control circuits 220 are described further below.

Each voltage control circuit may be located adjacent to a bit cell at an end of a corresponding column, e.g., adjacent to a bit cell in row 215-1 (as in FIG. 2A) or in row 215-NR. The spacing between each pair of adjacent voltage control circuits may be substantially equal to a cell pitch for bit cells in adjacent columns. For example, the spacing between voltage control circuits 220-1 and 220-2 may be substantially equal to the pitch for bit cells 210-1-1 and 210-1-2. Voltage control circuits may thus use space efficiently and occupy a relatively small footprint in terms of chip area. In some embodiments, the voltage control circuits 220 may be embedded into the SRAM array. The semiconductor devices of the SRAM array and of the voltage control circuits may be made using the same manufacturing process, e.g., using the same photolithography mask for N-type lightly-doped-drain (NLDD) or P-type lightly-doped-drain (PLDD) or pocket doping steps in a fabrication process. An embedded SRAM process usually includes a logic portion and an SRAM portion. The logic portion typically includes NLDDs and PLDDs for device tuning or adjustment of settings (e.g., high threshold voltage Vt (corresponding to a first mask MASK-1 and a first process process-1), standard Vt (corresponding to a second mask MASK-2 and a second process process-2), etc. Regarding the SRAM portion, products may adopt individual SRAM LDD processes for performance/standby and read/write margin optimization. The voltage control circuits in accordance with various embodiments may use either logic LDD processes or SRAM LDD processes.

Figure 2B:
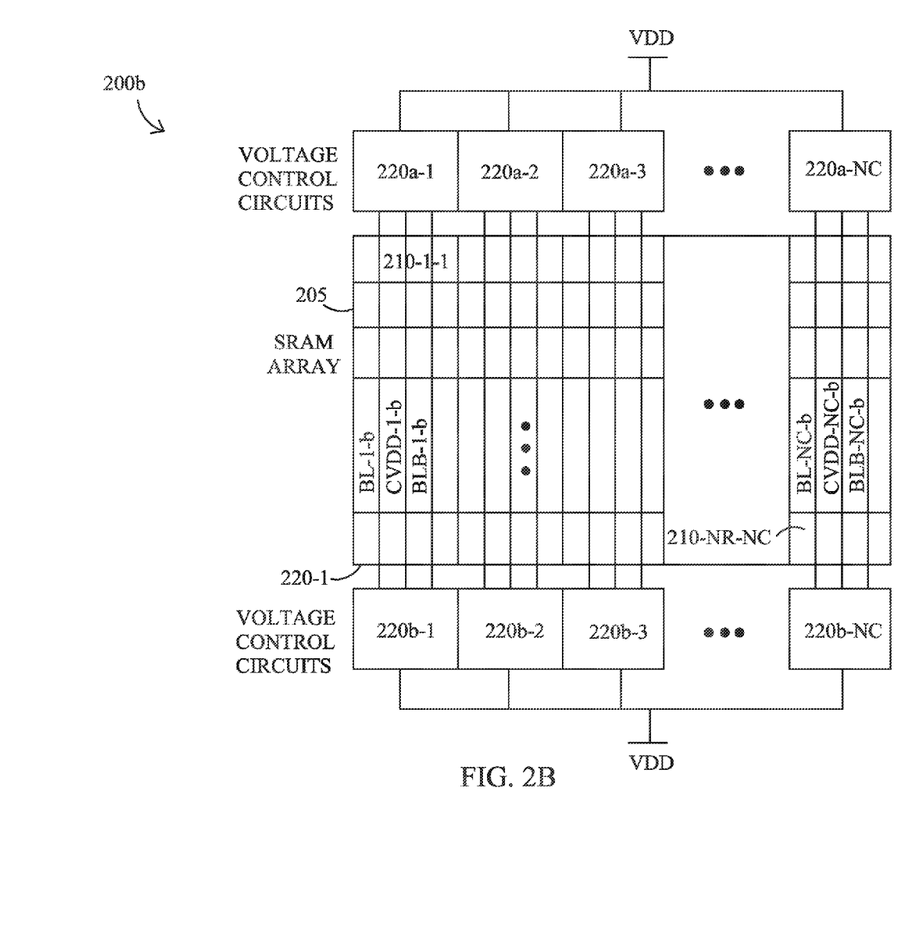

FIG. 2B is a schematic illustration of a memory apparatus 200*b* that is similar to apparatus 200*a* but with a pair of voltage control circuits coupled to each column of array 205. Various elements in FIG. 2B are similar to elements in FIG. 2A and are not shown with reference labels in FIG. 2B for graphical convenience. For column 220-1, voltage control circuits 220*a*-1 and 220*b*-1 control the voltage level at power line CVDD-1-*b* based on voltages at bit lines BL-1-*b* and BLB-1-*b*.

In SRAM operation, during each read or write cycle only one row and part of a column may be selected to be read or written. Other cells may be kept in a standby or "dummy" mode. For example, if the total number of columns NC is 128, during a write cycle only about 32 bits may change state (e.g., from 0 to 1 or vice versa) in some examples. Other bits in the row that is written to may be in a dummy read mode, in which a word line is turned on (asserted) and bit lines BL, BLB are precharged high, but no data changes state or is provided as output. Column-based voltage control circuits in various embodiments serve individual CVDD voltage requirements. At different columns of a single row, different voltages may be provided for write bits (decreased voltage CVDD) as opposed to non-selected bits that undergo a dummy read (voltage may be VDD or higher).

Figure 2C:
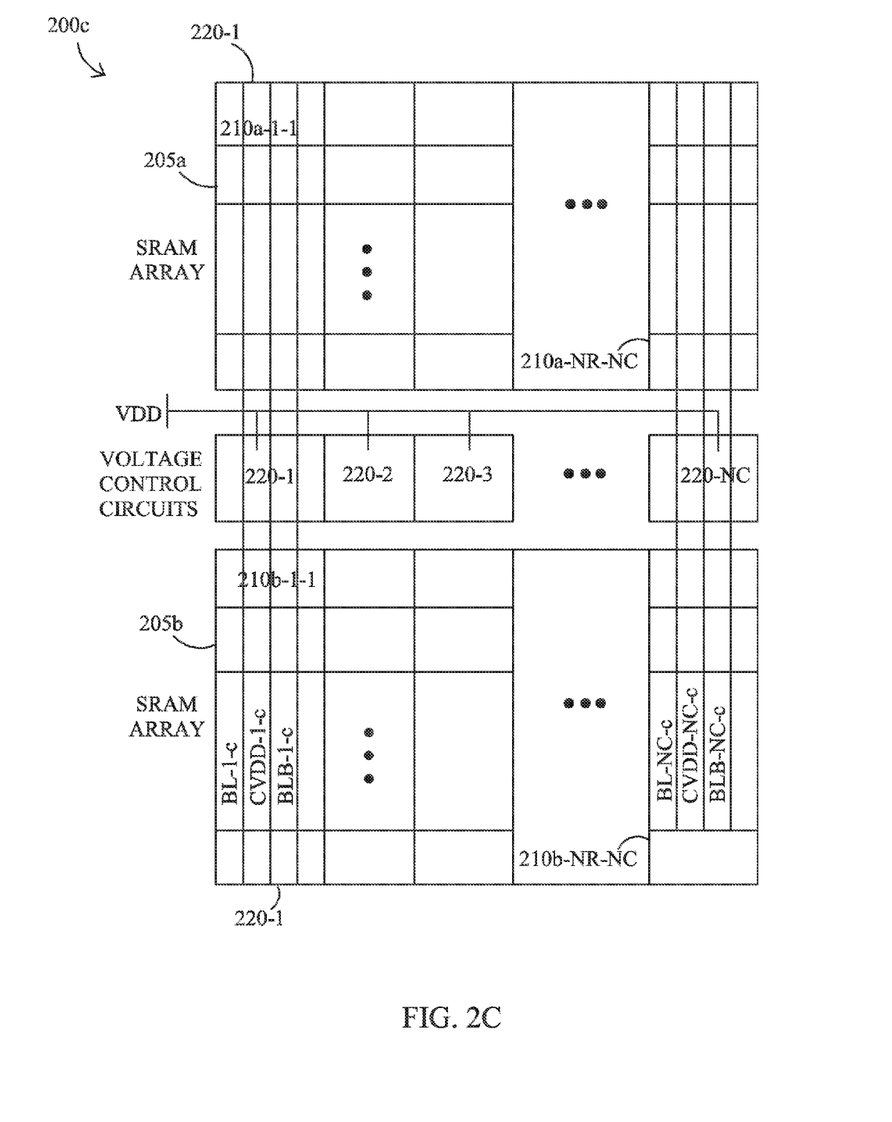

FIG. 2C is a schematic illustration of a memory apparatus 200*c* that is similar to apparatus 200*a* but with voltage control circuits 220 coupled to respective columns of array 205*a* and to respective columns of array 205*b*. Various elements in FIG. 2C are similar to elements in FIG. 2A and are not shown in FIG. 2C for graphical convenience. For column 220-1 of arrays 205*a* and 205*b*, voltage control circuits 220-1 and 220-1 control the voltage level at power line CVDD-1-*c* based on voltages at bit lines BL-1-*c* and BLB-1-*c*. Interposing voltage control circuits 220 between arrays 205*a* and 205*b* may reduce cost (e.g., due to a reduced number of voltage control circuits) and use space efficiently to conserve chip area.

Figure 3A:
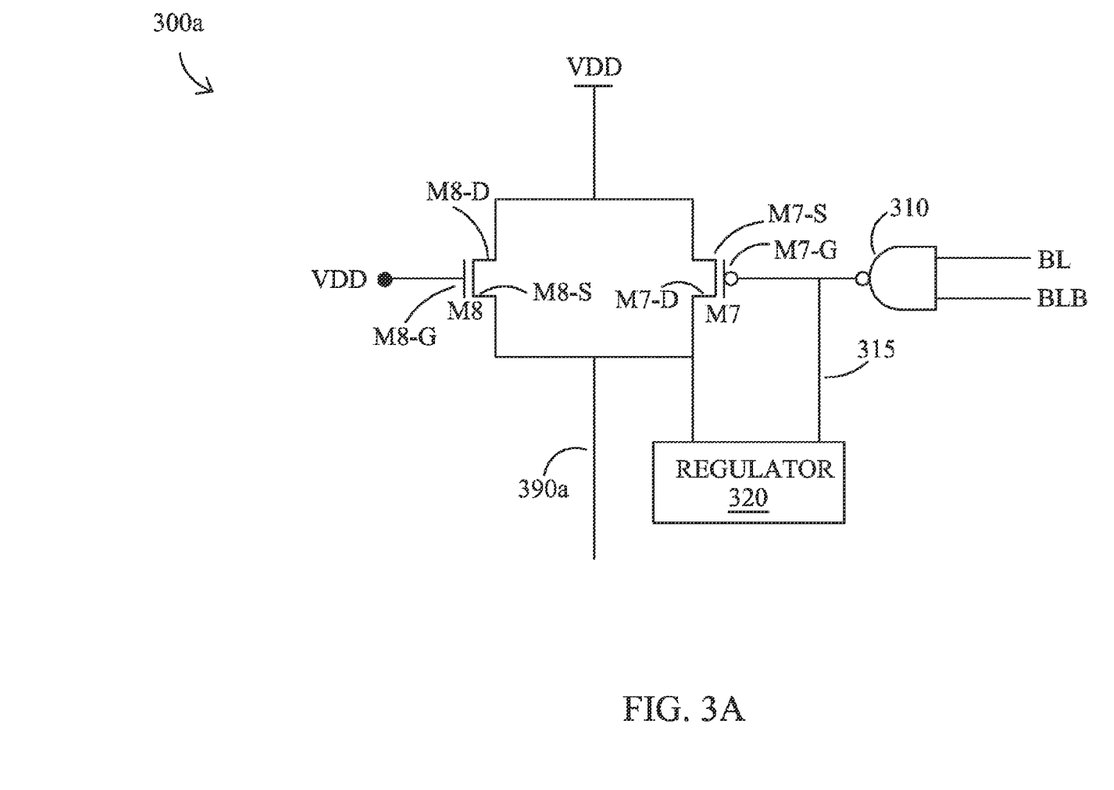
FIGS. 3A-3B are circuit diagrams of voltage control circuits in accordance with some embodiments.
Figure 3B:
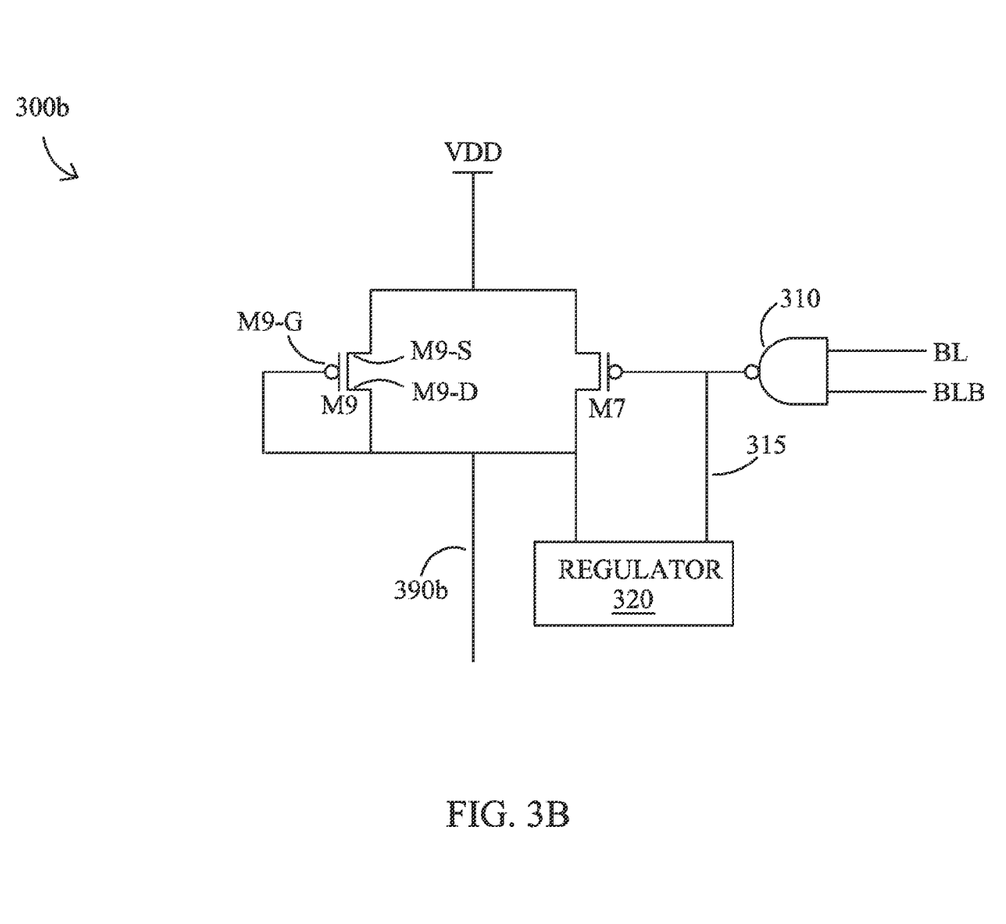

FIGS. 3A and 3B are circuit diagrams of voltage control circuits 300*a* and 300*b*, respectively, in accordance with some embodiments. Voltage control circuits 300*a* and 300*b* may be example implementations of the voltage control circuits shown in FIGS. 2A-2C. In FIG. 3A, a NAND gate 310 has input nodes coupled to bit lines BL and BLB and has an output node 315. NAND gate 310 may be any circuit that implements a logical NAND operation. An example of such a NAND circuit is described further below in the context of FIG. 6. A PMOS transistor M7 has a gate M7-G coupled to node 315, a source M7-S coupled to power supply voltage VDD, and a drain M7-D coupled to node 390*a*, which is the output node of voltage control circuit 300*a* and which may be a power line coupled to a bit cell (e.g., power line CVDD as in FIG. 1, power line CVDD-1-*a* as in FIG. 2A, etc.). An NMOS transistor M8 has a gate M8-G coupled to a predetermined voltage (e.g., VDD), a drain M8-D coupled to VDD, and a source M8-S coupled to node 390*a*.

For a read cycle, BL and BLB are both set to '1', and the NAND output at node 315 is '0'. PMOS transistor M7 is turned on (functions as a closed switch) and conducts current between its source and drain terminals. NMOS transistor M8, which is tied high in this example, is also on, but may present greater resistance to current flow than PMOS transistor M7. Therefore, transistor M7 may charge node 390*a* to a voltage equal to (or substantially equal to) VDD in this case. During a read cycle, the drain and source terminals of transistor M8 may be at the same or substantially same voltage level, so current may not flow between those source and drain terminals.

For a write cycle, one of the bit lines (BL or BLB) is set to '1' and the other is set to '0'. The NAND output at node 315 is '1', turning off transistor M7. NMOS transistor M8 is on, but may provide a voltage drop that causes node 390*a* to have a voltage that is less than VDD, e.g., about 70-90% of VDD. The voltage drop across M8 may be similar to a voltage drop across a resistor. Suppose M8 presents resistance R1 and node 390*a* presents resistance R2. The voltage drop ratio for M8 may be expressed as R1/(R1+R2). Therefore, the remaining voltage drop (i.e., for node 390*a*) may be VDD*(1−(R1))/(R1+R2). Thus, power line CVDD (which may be node 390*a*) may have a lower voltage level for a write operation than for a read operation, and the selection of the voltage level is based on the voltages at the bit lines.

In some embodiments, the gate of transistor M8 may instead be coupled to the output of NAND gate 310. In such an example, the NAND output at node 315 is '1' for a write cycle, turning on transistor M8 and causing current to flow between its drain and source terminals.

An optional regulator circuit 320 may regulate a characteristic of node 390a, e.g., a rate of switching from one voltage level at that node during a read cycle to another voltage level during a write cycle. Such regulation may be based on the output 315 of the NAND gate 310. Details of regulator 320 are discussed further below in the context of FIGS. 4 and 5.

Voltage control circuit 300b of FIG. 3B is similar to voltage control circuit 300a of FIG. 3A in several respects, and only differences are discussed here. A PMOS transistor M9 has a source M9-S coupled to the power supply voltage VDD, and a drain M9-D and gate M9-G both coupled to node 390b. Node 390b may be a power line CVDD similar to node 390a of FIG. 3A. In some embodiments, gate M9-G may be coupled to a predetermined voltage, e.g., in the range of 0.2*VDD to 0.8*VDD. Such a predetermined voltage may provide a circuit designer the freedom to tuen the final resistance of M9 and therefore control the CVDD voltage level. A predetermined voltage of 0.2*VDD may correspond to a low resistance setting, and a predetermined voltage of 0.8*VDD may correspond to a high resistance setting.

For a read cycle, PMOS transistor M7 is on, as described above regarding FIG. 3A. Node 390b is pulled to VDD, which turns off PMOS transistor M9.

For a write cycle, PMOS transistor M7 is off, which causes PMOS transistor M9 to be partially turned on. In that state, transistor M9 conducts current between its source and drain terminals, with a voltage drop that may cause the voltage at node 390b to be lower than VDD, e.g., about 70-85% of VDD. Voltage control circuit 300b may provide a lower CVDD level during a write cycle than is provided by voltage control circuit 300a.

Figure 4:
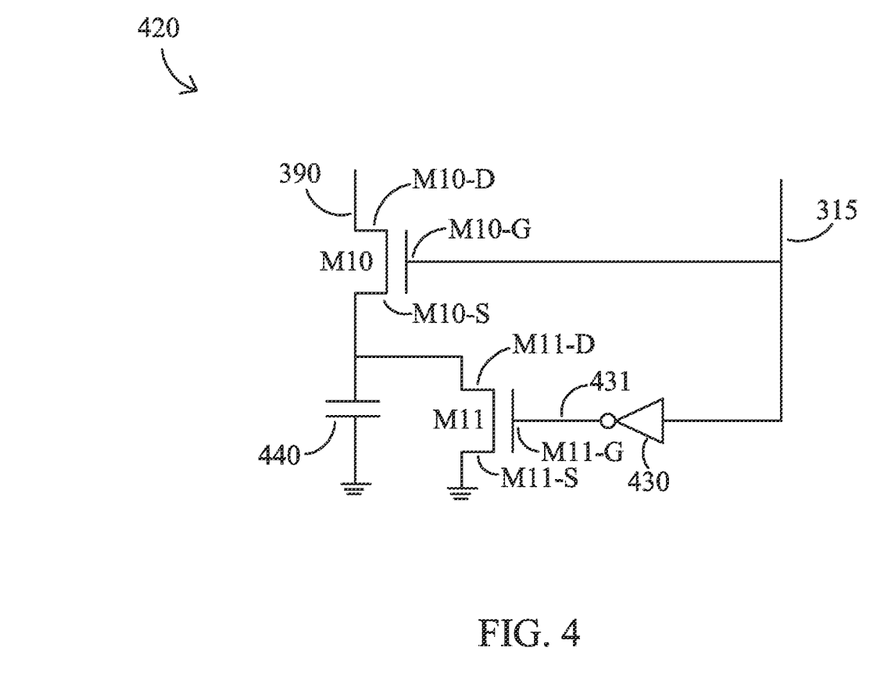
FIG. 4 is a circuit diagram of a regulator circuit in accordance with some embodiments.

FIG. 4 is a circuit diagram of a regulator circuit in accordance with some embodiments. Regulator circuit 420 may be an example implementation of regulator 320 in FIGS. 3A-3B. An inverter 430 has node 315 as an input. An NMOS transistor M10 has a drain M10-D coupled to node 390, which may be node 390a or 390b. Gate M10-G of transistor M10 is coupled to node 315. An NMOS transistor M11 has a gate M11-G coupled to the output 431 of inverter 430, a drain M11-D coupled to a source M10-S of transistor M10, and a source M11-S coupled to a reference voltage node (e.g., ground node). A capacitor 440 is coupled between the source M10-S of transistor M10 and a predetermined voltage, which may be ground. Capacitor 440 may be formed from a metal-insulator-metal (MIM) or metal-oxide-metal (MOM) structure and may be a MOSFET capacitor (e.g., large gate electrode/gate dielectric on a relatively wide active region).

Figure 7:
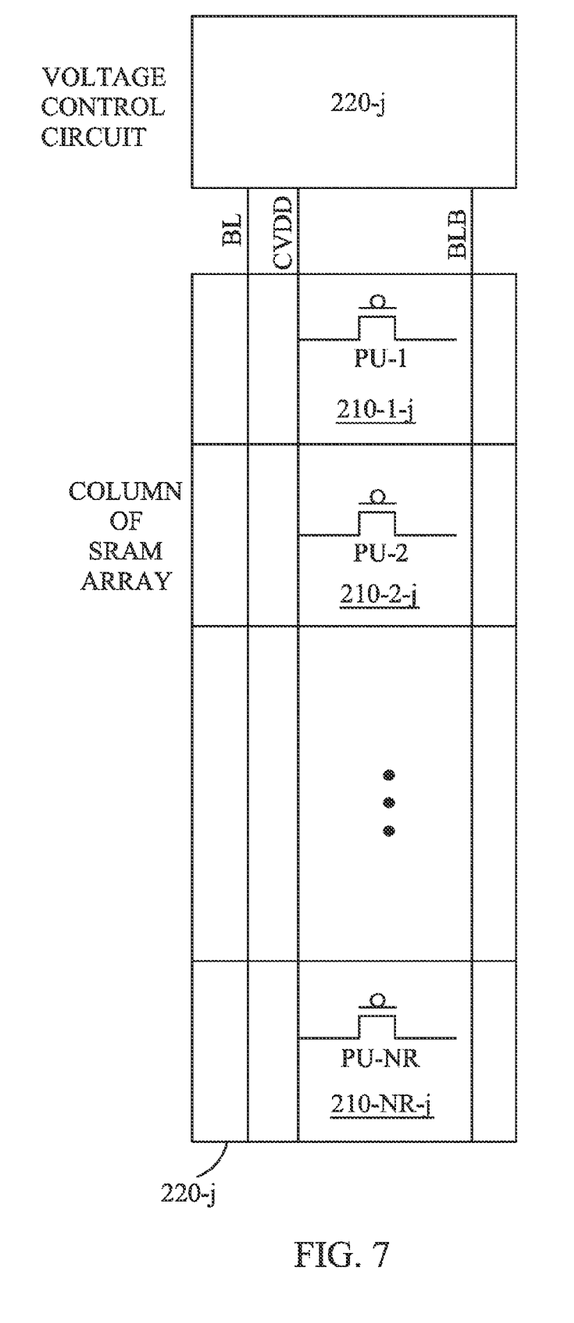
FIG. 7 is a block diagram of a column of an SRAM array coupled to a voltage control circuit in accordance with some embodiments.

The operation of regulator circuit 420 may be understood with reference to FIG. 7, which shows a voltage control circuit 220-j coupled to a column 220-j of SRAM array 205, where j may be an integer between 1 and $N_C$, inclusive. Voltage control circuit 220-j controls the voltage level of power line CVDD based on bit lines BL and BLB. CVDD may be a metal power line having a total coupling capacitance $C_{metal}$ that includes a metal line capacitance, a metal island capacitance, and a contact-to-gate capacitance. Metal line capacitance refers to a coupling capacitance between a CVDD line (e.g., entire column) and adjacent bit lines BL, BLB. Metal island capacitance depends on the metal layer of the CVDD line, i.e., whether the CVDD line is at a metal-1 layer or a metal-2 layer as discussed further below in the context of FIGS. 8A-8B. If CVDD is located at the metal-2 layer that is above the metal-1 layer, the metal island capacitance refers to a coupling capacitance between an M1 island and the adjacent M1 layer. If CVDD is located at the metal-1 layer, the metal island capacitance may be ignored, as the metal-1 layer may be directly connected to a contact and to the source terminal of a pull-up (PU) transistor. Contact-to-gate capacitance refers to a coupling capacitance between a PU source contact and the gate of a CMOSFET device.

Power line CVDD is coupled to pull-up devices PU-1, PU-2, . . . , PU-NR. Referring back to FIG. 1, PMOS transistors M1 and M3 are referred to as pull-up (PU) transistors because they may pull high a voltage at a data storage node of a bit cell. Each pull-up device PU-1, . . . , PU-NR may be a transistor such as M1. PU-1 may correspond to transistor M1 of FIG. 1, and PU-2 may correspond to transistor M3 of FIG. 1. Metal power line CVDD may have a capacitance C1 given by C1=$C_{metal}$+(Cp_s)(N_bits), where $C_{PU\_s}$ is the source node capacitance of each PU device, which includes source-to-junction capacitance, lightly doped drain (LDD)-to-gate overlay capacitance, and gate-to-source coupling capacitance; and N_bits is the number of bit cells coupled to the power line (in this example, N_bits=$N_R$).

During a read cycle, node 315 is low, and NMOS transistor M10 is off. NMOS transistor M11 is on, discharging capacitor 440 by providing a path to ground. Regulator circuit 420 is disabled, as capacitor 440 is disconnected from node 390.

The optional regulator circuit 420 provides capacitor 440, having a capacitance C2, in parallel with capacitance C1 during a write cycle. Without the parallel connection of capacitor 440 with C1, the charge corresponding to the metal power line is given by Q=C*V=C1*CVDD. Because V=Q/C, during a write cycle the potential at node 390 is given by Q/C=C1*CVDD/(C1+C2) when the parallel connected capacitor 440 is provided, where the term (C1+C2) corresponds to the parallel connection of capacitances C1 and C2. Thus, for a write cycle, CVDD is multiplied by the ratio C1/(C1+C2), and the voltage at node 390 is reduced during a write cycle due to capacitor 440 in the regulator circuit 420. In this manner, a voltage transition at node 390 from the level VDD during a read cycle to a lower level during a write cycle may be sped up.

Figure 5:
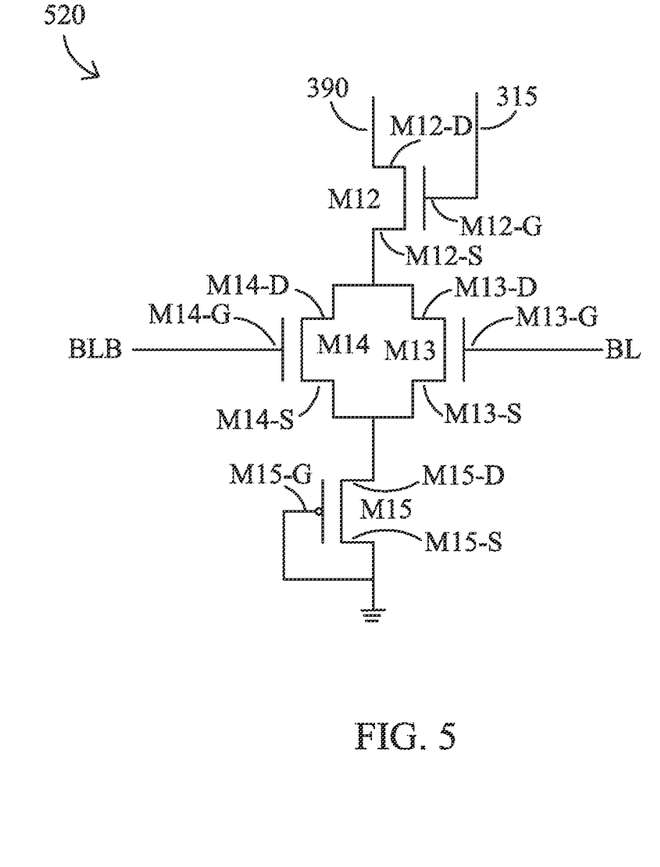
FIG. 5 is a circuit diagram of another regulator circuit in accordance with some embodiments.

FIG. 5 is a circuit diagram of another regulator circuit in accordance with some embodiments. Regulator circuit 520 may be an example implementation of regulator 320 in FIGS. 3A-3B. NMOS transistor M12 has a drain M12-D coupled to node 390, which may be node 390a or 390b. Gate M12-G of transistor M12 is coupled to node 315. NMOS transistors M13 and M14 have respective drains M13-D and M14-D coupled to a source M12-S of transistor M12, and have gates M13-G and M14-G coupled to BL and BLB, respectively. A PMOS transistor M15 has a drain M15-D coupled to sources M13-S and M14-S of transistors M13 and M14, respectively, and has a gate M15-G and a source M15-S both coupled to ground.

Operation of regulator circuit 520 may be understood by first considering what happens if there is no regulator circuit 520. Suppose node 390 has voltage VDD for a read cycle and voltage $CVDD_{write}$ for a write cycle. Recalling that power line CVDD (which may be node 390) has capacitance C1 and that charge, capacitance, voltage, and current are related by Q=C*V=I*t (where I is discharge current and t is discharge time), it follows that ΔQ=C1*ΔV=C1*(VDD-$CVDD_{write}$)= $I_{PU\_leakage}$*t, where $I_{PU\_leakage}$ is a current flowing across a PU device of FIG. 7. Thus, without regulator circuit 520, the discharge time (time for transitioning CVDD between a first voltage level VDD for a read cycle and a lower voltage level for a write cycle) is t=C1*(VDD−$CVDD_{write}$)/$I_{PU\_leakage}$.

With regulator circuit 520 included, during a write cycle, current $I_{regulator}$ flows from node 390 to ground through transistors M12 (which is on because node 315 is low during a write cycle), one of NMOS transistors M13 and M14 (one of which is guaranteed to be on because BL and BLB have complementary values during a write cycle), and PMOS transistor M15 (which has gate M15-G tied low). In this case, with the additional discharge path provided by regulator circuit 520, the total discharge current is=$I_{PU\_leakage}+I_{regulator}$. Then $\Delta Q=C1*\Delta V=C1*(VDD-CVDD_{write})=(I_{PU\_leakage}+I_{regulator})*t$, and $t=C1*(VDD-CVDD_{write})/(I_{PU\_leakage}+I_{regulator})$, which is a shorter discharge time than for the foregoing case where there is no regulator circuit 520. Thus, the discharge time is reduced, due to the additional discharge path provided by regulator circuit 520. If the memory array enters a sleep mode, transistors M13 and M14 prevent unexpected current leakage as follows. In sleep mode, bit lines BL and BLB may both drop to low voltage. As a result, node 315 (the output node of NAND gate 310) is high, and NMOS transistor M12 is turned on. NMOS transistors M13 and M14 are turned off in this case and thus cut off the current leakage path.

The voltage $CVDD_{write}$ for the write cycle may be between 0.55*VDD and 0.75*VDD in some examples, according to simulations, and that quantity may depend on characteristics of the transistors in the regulator circuit, such as width-to-length ratio and threshold voltage $V_t$.

Figure 6:
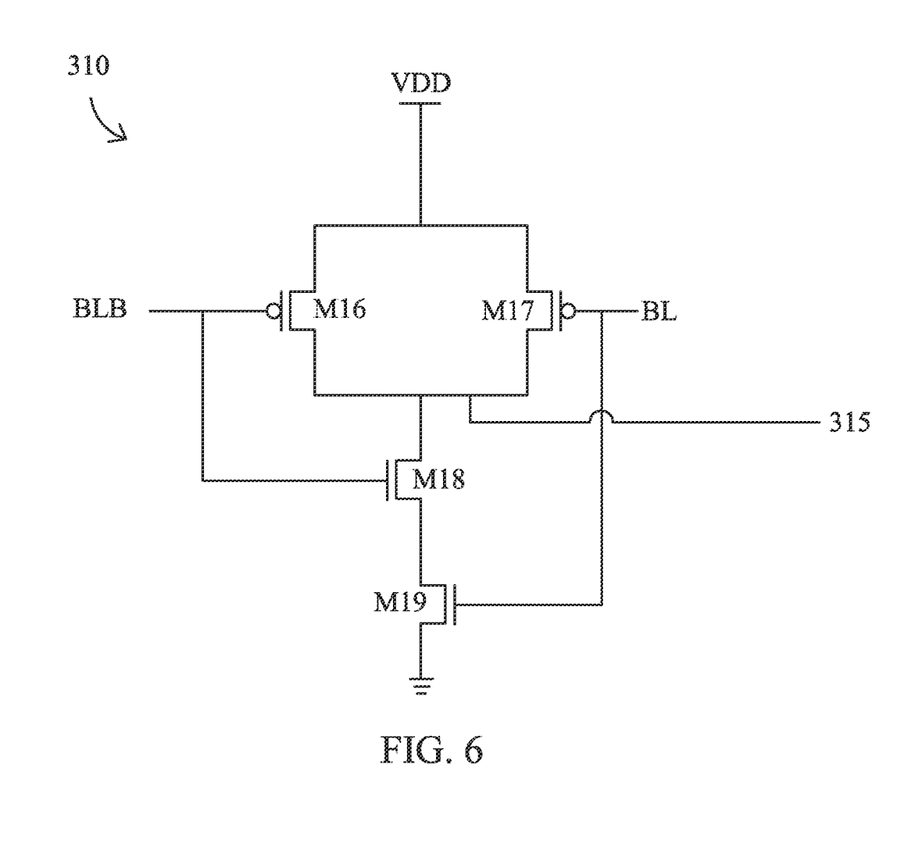
FIG. 6 is a circuit diagram of a NAND circuit that may be used in accordance with some embodiments.

FIG. 6 is a circuit diagram of a NAND logic circuit 310 that may be used in accordance with some embodiments. If BL is low and BLB is high, then PMOS transistor M16 is off and NMOS transistor M17 is on, and node 315 is pulled high by M17. If BL is high and BLB is low, then transistors M16 and M17 are on and off, respectively, and node 315 is pulled high by M16. If BL and BLB are both high, then NMOS transistors M18 and M19 are on, and node 315 is pulled low by the path those transistors provide to ground. If BL and BLB are both low, then node 315 is pulled high, and there is no path to ground because transistors M18 and M19 are off. Various other NAND circuits may be used as well.

Figure 8A:
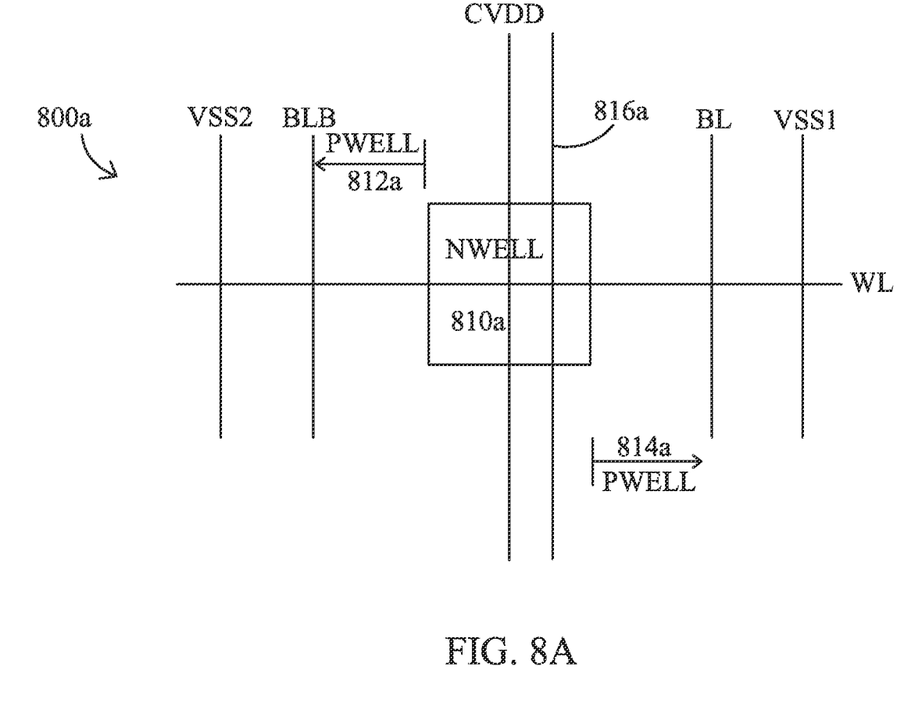
Figure 8B:
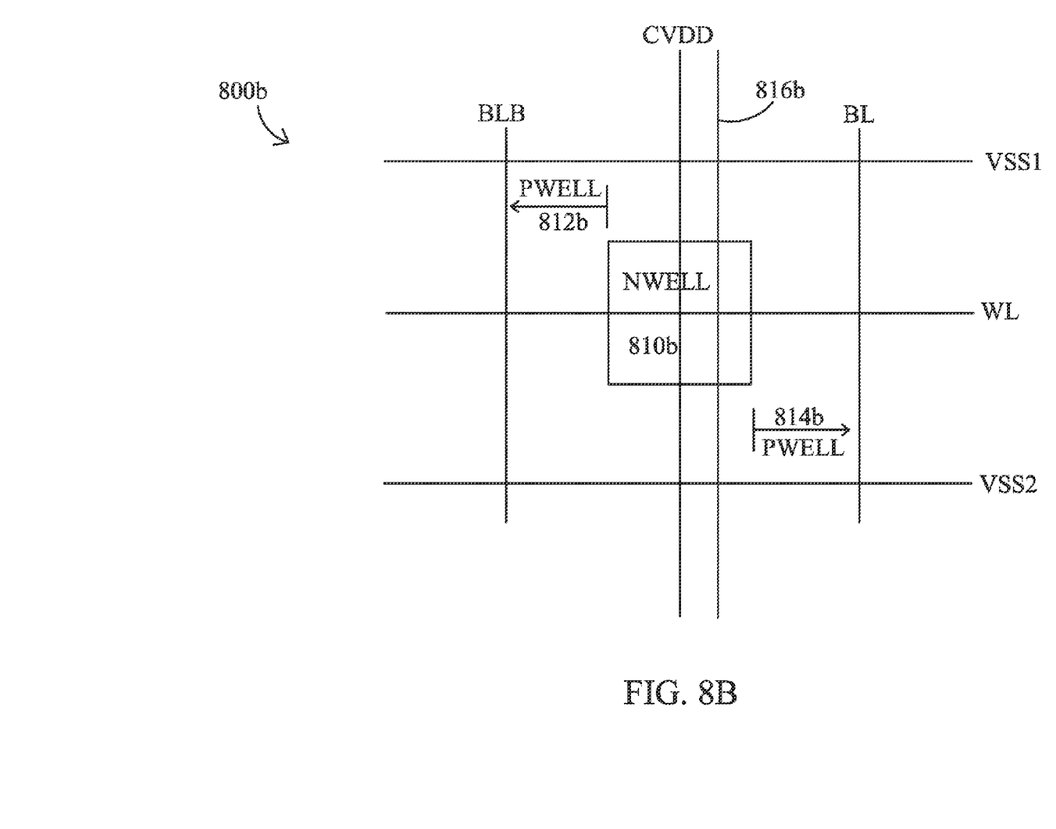

FIGS. 8A-8B are plan (top) views of layouts of SRAM bit cells in accordance with some embodiments. In layout 800a of FIG. 8A, a word line WL is formed at a first metal layer (e.g., metal-1 layer). Power line CVDD, bit lines BL and BLB, and reference voltage lines VSS1 and VSS2 are formed at a second metal layer (e.g., metal-2 layer) above the first metal layer. N-well 810a and P-wells 812a and 814a are formed as shown in FIG. 8A. In layout 800b of FIG. 8B, CVDD and bit lines BL, BLB are formed at a first metal layer (e.g., metal-1 layer). Word line WL and reference voltage lines VSS1 and VSS2 are formed at a second metal layer (e.g., metal-2 layer) above the first metal layer. N-well 810b and P-wells 812b and 814b are formed as shown in FIG. 8B. The CVDD lines in FIGS. 8A and 8B may be controlled by a voltage control circuit as described above. Metal lines 816a and 816b may be formed in layouts 800a and 800b, respectively to provide capacitor 440.

Embodiments of the present disclosure may provide voltage control for power lines of various types of SRAM, including single port (SP) SRAM, two-port SRAM (SP SRAM as a write port with additional cascaded NMOSFETs forming a read port), dual-port SRAM, and any type of SRAM based on a pair of cross-coupled inverters. Likewise, embodiments may provide voltage control for other types of memory as desired.

Figure 9:
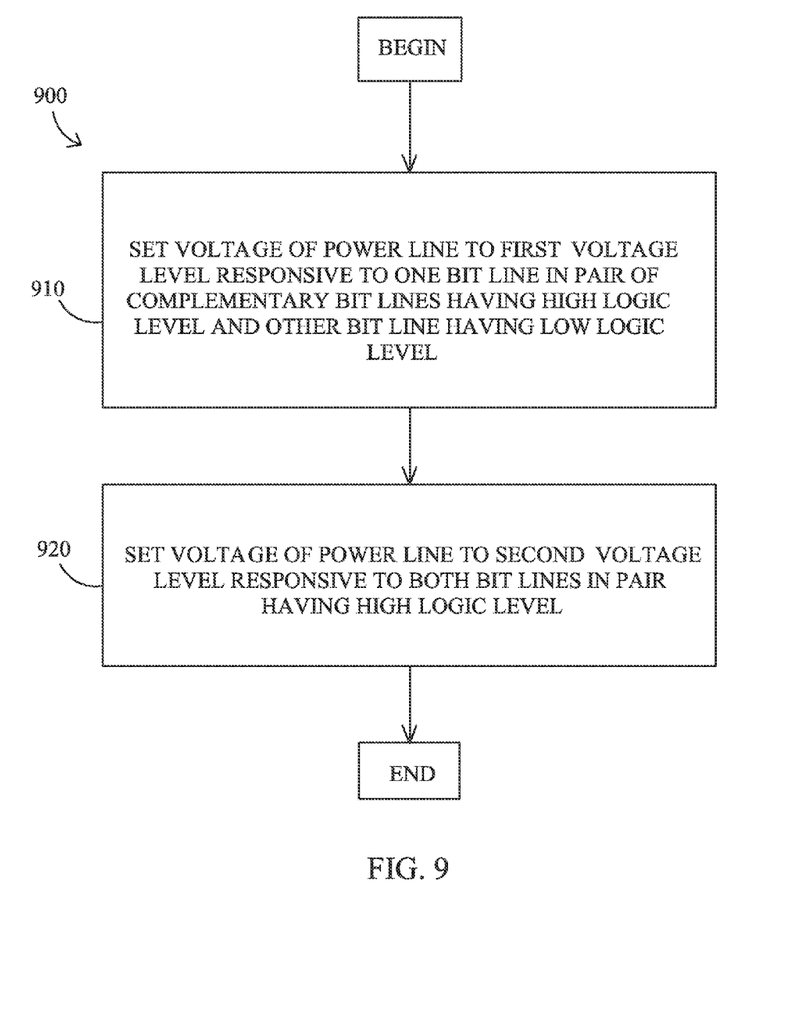
FIG. 9 is a flow diagram of a process in accordance with some embodiments.

FIG. 9 is a flow diagram of a process in accordance with some embodiments. The process may be a method of supplying power to a memory array. The memory array may have multiple memory cells arranged in rows and columns, with each column having a pair of complementary bit lines coupled to the bit cells in that column. After process 900 begins, a voltage of a power line coupled to the bit cells of one of the columns is set (910) to a first voltage level responsive to one of the bit lines in the pair of bit lines corresponding to said one column having a high logic level and the other bit line in said pair having a low logic level. The voltage of that power line is set (920) to a second voltage level responsive to both the bit lines in that pair having the high logic level.

In some embodiments, a memory apparatus includes an array of bit cells arranged in rows and columns, multiple pairs of complementary bit lines, multiple power lines, and multiple voltage control circuits. Each column of the array is selectable by a corresponding pair of complementary bit lines. Each power line is coupled to the bit cells in a corresponding column. The voltage control circuits are coupled to respective columns of the array. Each voltage control circuit is configured to set a voltage level of a respective one of the power lines responsive to logic levels of the pair of complementary bit lines corresponding to the respective column.

In some embodiments, a power supply configuration for a memory includes a NAND logic circuit, first and second metal oxide semiconductor (MOS) transistors, and a regulator circuit. The NAND logic circuit includes first and second input nodes and an output node. The first MOS transistor includes a gate coupled to the output node of the NAND circuit, a source coupled to a power supply voltage, and a drain coupled to a power line. The first MOS transistor may be a PMOS transistor. The second MOS transistor includes a first terminal coupled to the power line, and a second terminal coupled to the power supply voltage. The regulator circuit is coupled to the output node of the NAND circuit and to the power line. The regulator circuit is configured to regulate a characteristic of a voltage at the power line, based on a voltage at the output node of the NAND circuit.

In some embodiments, a memory array may have multiple memory cells arranged in rows and columns, with each column having a pair of complementary bit lines coupled to the bit cells in that column. A voltage of a power line coupled to the bit cells of one of the columns is set to a first voltage level responsive to one of the bit lines in the pair of bit lines corresponding to said one column having a high logic level and the other bit line in said pair having a low logic level. The voltage of that power line is set to a second voltage level responsive to both the bit lines in that pair having the high logic level.

Although examples are illustrated and described herein, embodiments are nevertheless not limited to the details shown, since various modifications and structural changes may be made therein by those of ordinary skill within the scope and range of equivalents of the claims.

What is claimed is:

1. A memory apparatus comprising:
    an array of bit cells arranged in rows and columns;
    a plurality of pairs of complementary bit lines, each column of the array being selectable by a corresponding pair of complementary bit lines;
    a plurality of power lines, each power line coupled to the bit cells in a corresponding column; and
    a plurality of voltage control circuits coupled to respective columns of the array, each voltage control circuit configured to set a voltage level of a respective one of the power lines responsive to logic levels of the pair of complementary bit lines corresponding to the respective column;

wherein each voltage control circuit comprises:
> a NAND logic circuit including first and second input nodes coupled to the respective bit lines in the pair of bit lines corresponding to the respective column;
> a first PMOS transistor including a gate coupled to an output node of said NAND logic circuit, a source coupled to a power supply voltage, and a drain coupled to the power line corresponding to the respective column;
> a second PMOS transistor including a source coupled to the power supply voltage, a drain coupled to the power line corresponding to the respective column, and a gate coupled to the drain of said second PMOS transistor;
> a first NMOS transistor including a drain coupled to the power line corresponding to the respective column, and a gate coupled to the output node of said NAND logic circuit;
> a second NMOS transistor including a gate coupled to a first bit line in said pair of bit lines corresponding to the respective column, and a drain coupled to a source of said first NMOS transistor;
> a third NMOS transistor including a gate coupled to a second bit line in said pair of bit lines, and a drain coupled to the source of said first NMOS transistor; and
> a third PMOS transistor including a drain coupled to sources of said second and third NMOS transistors, a gate coupled to a ground node, and a source coupled to said ground node.

2. The memory apparatus of claim 1, wherein said array of bit cells is a static random access memory (SRAM) array.

3. The memory apparatus of claim 1, wherein each voltage control circuit is located adjacent to a bit cell at an end of the respective column.

4. The memory apparatus of claim 3, wherein the plurality of voltage control circuits is a first plurality of voltage control circuits, the apparatus further comprising a second plurality of voltage control circuits coupled to respective columns of the array;
> wherein each voltage control circuit of the second plurality is configured to set the voltage level for a respective one of the power lines responsive to the logic levels of the pair of complementary bit lines corresponding to the respective column;
> wherein each voltage control circuit of the second plurality is disposed adjacent to a bit cell at another end of the respective column.

5. The memory apparatus of claim 3, wherein the array of bit cells is a first array of bit cells, the apparatus further comprising a second array of bit cells arranged in rows and columns, the first and second arrays having a common number of columns, each column of the second array being selectable by a corresponding pair of complementary bit lines, each power line coupled to the bit cells of the second array in a corresponding column;
> wherein each voltage control circuit is coupled to a column of the second array, and the columns in the first and second arrays to which each voltage control circuit is coupled are the same;
> wherein each voltage control circuit is located adjacent to a bit cell of the second array at an end of the respective column.

6. The memory apparatus of claim 1, wherein each voltage control circuit is configured to selectably provide, at a corresponding power line, first and second voltage levels for write and read operations, respectively, accessing said array of bit cells.

7. The memory apparatus of claim 6, wherein each voltage control circuit is coupled to the power supply voltage, and the second voltage level is substantially equal to the power supply voltage.

8. A power supply configuration for a memory comprising:
> a NAND logic circuit including first and second input nodes and an output node;
> a first MOS transistor including a gate coupled to the output node of said NAND logic circuit, a source coupled to a power supply voltage, and a drain coupled to a power line, said first MOS transistor being a PMOS transistor;
> a second MOS transistor including a first terminal coupled to the power line, and a second terminal coupled to the power supply voltage; and
> a regulator circuit coupled to the output node of said NAND logic circuit and to the power line, said regulator circuit configured to regulate a characteristic of a voltage at the power line, based on a voltage at the output node of said NAND logic circuit, said regulator circuit including:
>> a third MOS transistor including a drain coupled to the power line, and a gate coupled to the output node of said NAND logic circuit, said third MOS transistor being an NMOS transistor;
>> a fourth MOS transistor including a gate coupled to one of the first and second input nodes of said NAND logic circuit, and a drain coupled to a source of said third MOS transistor, said fourth MOS transistor being an NMOS transistor;
>> a fifth MOS transistor including a gate coupled to the other of the first and second input nodes, and a drain coupled to the source of said third MOS transistor, said fifth MOS transistor being an NMOS transistor; and
>> a sixth MOS transistor including a drain coupled to sources of said fourth and fifth MOS transistors, a gate coupled to a ground node, and a source coupled to said ground node, said sixth MOS transistor being a PMOS transistor.

9. The apparatus of claim 8, further comprising:
an array of bit cells arranged in rows and columns; and
first and second bit lines configured to select a corresponding column of the array;
> wherein the first and second input nodes of said NAND logic circuit are coupled to said first and second bit lines, respectively.

10. The memory apparatus of claim 8, wherein said second MOS transistor is an NMOS transistor, and said first and second terminals are source and drain terminals, respectively, said second MOS transistor further including a gate coupled to the power supply voltage.

11. The memory apparatus of claim 8, wherein said second MOS transistor is a PMOS transistor, and said first and second terminals are drain and source terminals, respectively, said second MOS transistor further including a gate coupled to the drain terminal of said second MOS transistor.

12. A memory apparatus comprising:
an array of bit cells arranged in rows and columns;
a plurality of pairs of complementary bit lines, each column of the array being selectable by a corresponding pair of complementary bit lines;
a plurality of power lines, each power line coupled to the bit cells in a corresponding column; and a plurality of voltage control circuits coupled to respective columns of the array, each voltage control circuit configured to set a voltage level of a respective one of the power lines responsive to logic levels of the pair of complementary bit lines corresponding to the respective column;

wherein each voltage control circuit comprises:

a NAND logic circuit including first and second input nodes coupled to the respective bit lines in the pair of bit lines corresponding to the respective column;

a first PMOS transistor including a gate coupled to an output node of said NAND logic circuit, a source coupled to a power supply voltage, and a drain coupled to the power line corresponding to the respective column;

a first NMOS transistor including a drain coupled to the power line corresponding to the respective column, and a gate coupled to the output node of said NAND logic circuit;

a second NMOS transistor including a gate coupled to a first bit line in said pair of bit lines corresponding to the respective column, and a drain coupled to a source of said first NMOS transistor;

a third NMOS transistor including a gate coupled to a second bit line in said pair of bit lines, and a drain coupled to the source of said first NMOS transistor; and a second PMOS transistor including a drain coupled to sources of said second and third NMOS transistors, a gate coupled to a ground node, and a source coupled to said ground node.

* * * * *